(12) United States Patent
Chung et al.

(10) Patent No.: US 9,803,279 B2
(45) Date of Patent: Oct. 31, 2017

(54) APPARATUS AND METHOD FOR MANUFACTURING DISPLAY APPARATUS

(71) Applicant: SAMSUNG DISPLAY CO., LTD., Yongin, Gyeonggi-Do (KR)

(72) Inventors: Yunah Chung, Yongin (KR); Eungseok Park, Yongin (KR); Wonmin Yun, Yongin (KR); Byoungduk Lee, Yongin (KR); Yoonhyeung Cho, Yongin (KR); Yongchan Ju, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 126 days.

(21) Appl. No.: 14/676,959

(22) Filed: Apr. 2, 2015

(65) Prior Publication Data

US 2016/0111680 A1    Apr. 21, 2016

(30) Foreign Application Priority Data

Oct. 20, 2014  (KR) .................. 10-2014-0141697

(51) Int. Cl.
*H01L 51/52* (2006.01)
*C23C 16/455* (2006.01)
*C23C 16/04* (2006.01)
*H01L 51/00* (2006.01)

(52) U.S. Cl.
CPC ...... *C23C 16/45544* (2013.01); *C23C 16/042* (2013.01); *H01L 51/0011* (2013.01)

(58) Field of Classification Search
CPC ....... H01L 25/046; H01L 27/28; H01L 27/32; H01L 27/3202; H01L 27/3204; H01L 27/3209; H01L 27/3206; H01L 27/3211; H01L 27/3213; H01L 27/3225; H01L 27/3251; H01L 51/00
See application file for complete search history.

(56) References Cited

U.S. PATENT DOCUMENTS

| | | | |
|---|---|---|---|
| 2010/0200846 A1 | 8/2010 | Kwack et al. | |
| 2010/0201261 A1 | 8/2010 | Kwack et al. | |
| 2012/0208306 A1* | 8/2012 | Haas | H01L 51/0014 438/26 |
| 2012/0235171 A1 | 9/2012 | Kim et al. | |
| 2013/0092972 A1* | 4/2013 | Kim | H01L 51/5256 257/100 |

FOREIGN PATENT DOCUMENTS

| | | |
|---|---|---|
| KR | 10-0759437 B1 | 9/2007 |
| KR | 10-2010-0090887 A | 8/2010 |
| KR | 10-2010-0090888 A | 8/2010 |
| KR | 10-2012-0106453 A | 9/2012 |

* cited by examiner

*Primary Examiner* — Selim Ahmed
(74) *Attorney, Agent, or Firm* — Lee & Morse, P.C.

(57) ABSTRACT

An apparatus for manufacturing a display apparatus includes a stage supporting a substrate, a deposition gas supplying unit above the substrate, the deposition gas supplying unit spraying a deposition gas onto the substrate, and a first mask between the stage and the deposition gas supplying unit, the first mask including at least two first openings through which the deposition gas selectively passes.

14 Claims, 3 Drawing Sheets

APPARATUS AND METHOD FOR MANUFACTURING DISPLAY APPARATUS

CROSS-REFERENCE TO RELATED APPLICATION

Korean Patent Application No. 10-2014-0141697, filed on Oct. 20, 2014, in the Korean Intellectual Property Office, and entitled: "Apparatus and Method for Manufacturing Display Apparatus," is incorporated by reference herein in its entirety.

BACKGROUND

1. Field

One or more exemplary embodiments relate to an apparatus and method, and more particularly, to an apparatus and method for manufacturing a display apparatus.

2. Description of the Related Art

Portable electronic devices have been widely used. Small electronic devices, e.g., mobile phones, tablet personal computers (PCs), etc., have been widely used as portable electronic devices.

In order to support various functions, such portable electronic devices include a display apparatus so as to provide visual information, e.g., an image or a video, to a user. As other components for driving the display apparatus recently become smaller, the proportion of the display apparatus to the other components in the electronic devices is gradually increasing, and a structure that may be bent to have a certain angle in a flat state has also been developed.

In order to implement such a flexible display apparatus as described above, a thin film encapsulation layer including an organic layer and an inorganic layer may be used. In this case, the performance of the thin film encapsulation layer may be determined depending on how uniformly the organic layer is coated on the inorganic layer in a stack structure of the inorganic layer and the organic layer.

SUMMARY

According to one or more exemplary embodiments, an apparatus for manufacturing a display apparatus includes a stage supporting a substrate, a deposition gas supplying unit above the substrate, the deposition gas supplying unit spraying a deposition gas onto the substrate, and a first mask between the stage and the deposition gas supplying unit, the first mask including at least two first openings through which the deposition gas selectively passes.

The at least two first openings may be formed to correspond to an organic light-emitting device formed on the substrate.

The apparatus may further include a second mask that is installed to be exchanged with the first mask and may include one second opening.

The second opening of the second mask may be larger than a combined size of the at least two first openings in the first mask.

The apparatus may further include a chamber accommodating the stage, the deposition gas supplying unit, and the first mask.

According to one or more exemplary embodiments, a method for manufacturing a display apparatus includes forming a display unit on a substrate, the display unit including organic light-emitting devices, placing the substrate with the display unit on a stage, spraying a deposition gas onto the substrate from a deposition gas supplying unit through at least two openings of a first mask, such that a first inorganic layer is formed in at least two corresponding inserted portions of the organic light-emitting devices in the display unit, and forming a second inorganic layer on the first inorganic layer.

Forming the first inorganic layer may include forming the first inorganic layer in a form of a pattern on the display unit using the first mask with the at least two openings.

Forming the second inorganic layer may include planarizing one surface of the second inorganic layer.

The method may further include forming a halogenation metal layer of lithium fluoride (LiF) between the first inorganic layer and the display unit and between the second inorganic layer and the display unit.

The method may further include forming a first organic layer on the second inorganic layer using an inkjet printing process.

The second inorganic layer may be formed before the first inorganic layer, a portion of the second inorganic layer being indented into the inserted portions of the organic light-emitting devices.

The first inorganic layer may be formed in the at least two corresponding inserted portions of the organic light-emitting devices to contact an upper surface of the second inorganic layer.

The first inorganic layer may be formed before the second inorganic layer, the second inorganic layer contacting an upper surface of the first inorganic layer.

According to one or more exemplary embodiments, a method for manufacturing a display apparatus, includes: forming a display unit on a substrate; forming a second inorganic layer along an outer surface of the display unit; and forming a first inorganic layer on an inserted portion of the second inorganic layer so as to fill the inserted portion of the second inorganic layer.

The first inorganic layer may be formed in a form of a pattern on the second inorganic layer using a mask including at least two openings.

The first inorganic layer may be formed in a form of a pattern on the display unit using a mask including at least two openings.

The first inorganic layer and the second inorganic layer may constitute one plane.

The method may further include forming lithium fluoride (LiF) between the second inorganic layer and the display unit.

The method may further include forming a first organic layer on the first inorganic layer and the second inorganic layer using an inkjet printing process.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
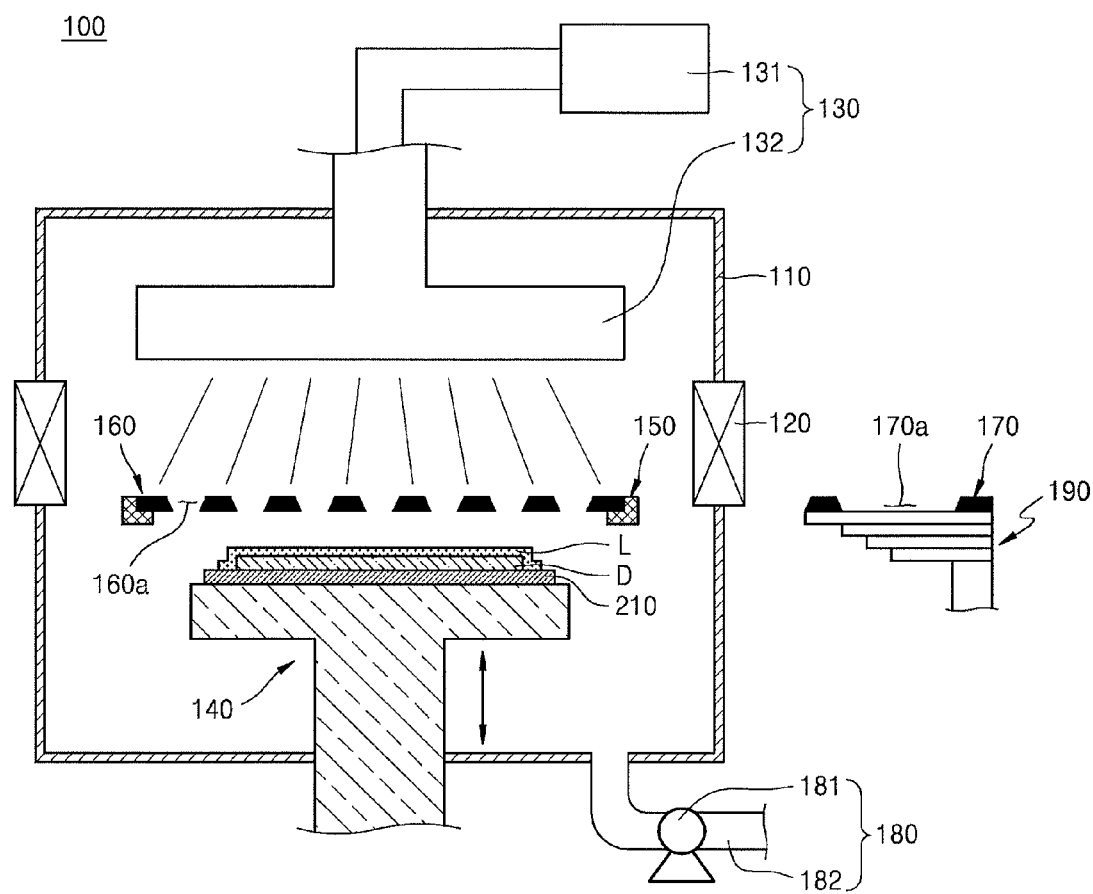
FIG. 1 illustrates a schematic cross-sectional view of an apparatus for manufacturing a display apparatus according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer, i.e., an element, is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

It will be understood that although the terms "first", "second", etc. may be used herein to describe various components, these components should not be limited by these terms. These components are only used to distinguish one component from another. As used herein, the singular forms "a," "an" and "the" are intended to include the plural forms as well, unless the context clearly indicates otherwise. It will be further understood that the terms "comprises" and/or "comprising" used herein specify the presence of stated features or components, but do not preclude the presence or addition of one or more other features or components.

When a certain embodiment may be implemented differently, a specific process order may be performed differently from the described order. For example, two consecutively described processes may be performed substantially at the same time or performed in an order opposite to the described order. As used herein, the term "and/or" includes any and all combinations of one or more of the associated listed items.

Figure 2:
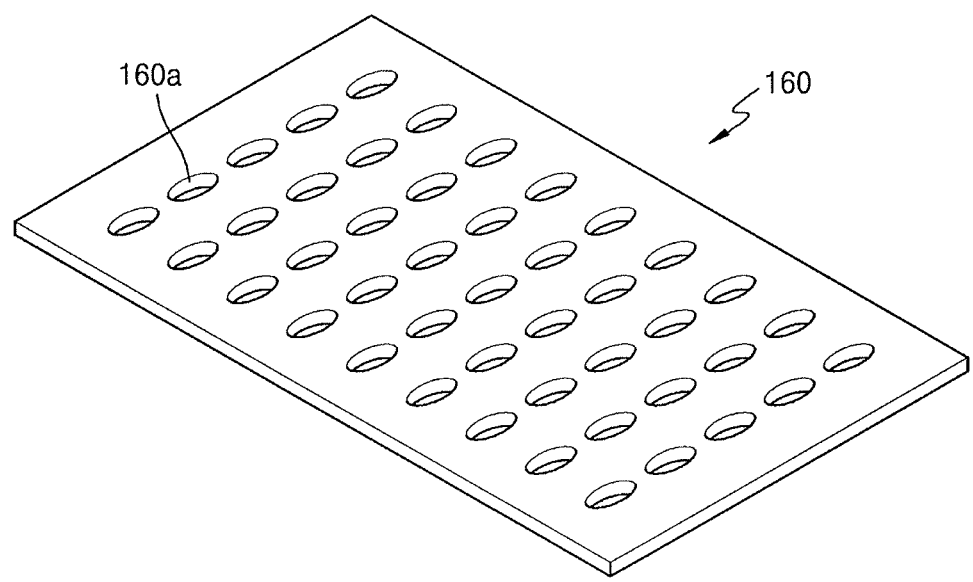
FIG. 2 illustrates a perspective view of a first mask in FIG. 1.
Figure 3:
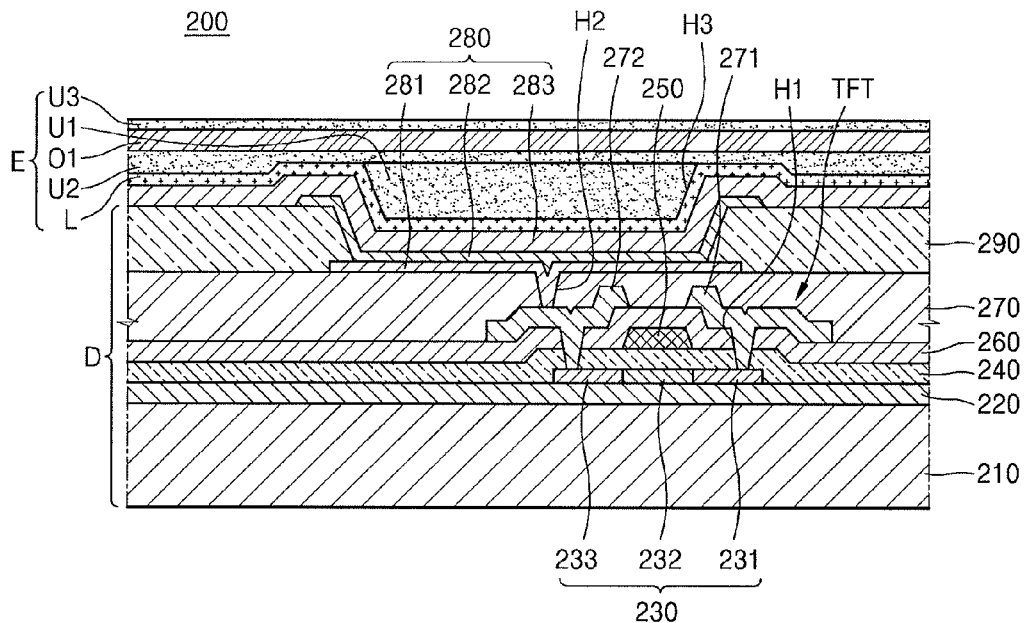
FIG. 3 illustrates a cross-sectional view of part of the display apparatus manufactured using the apparatus illustrated in FIG. 1, according to an exemplary embodiment.
Figure 4:
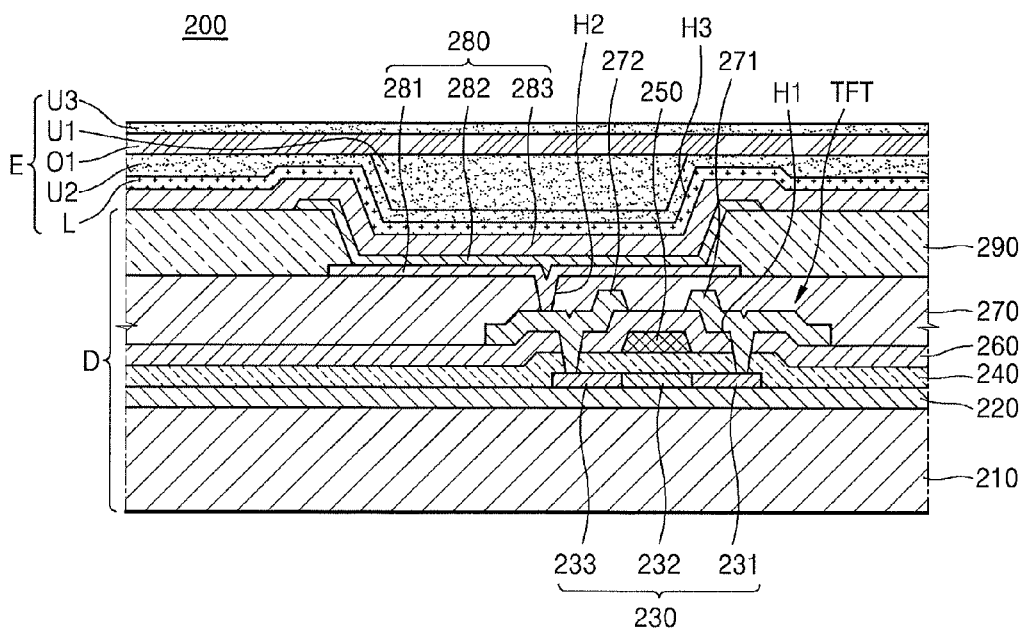
FIG. 4 illustrates a cross-sectional view of part of the display apparatus manufactured using the apparatus illustrated in FIG. 1, according to another exemplary embodiment.

FIG. 1 is a cross-sectional view of an apparatus for manufacturing a display apparatus according to an exemplary embodiment. FIG. 2 is a perspective view of a first mask illustrated in FIG. 1. FIG. 3 is a cross-sectional view of part of the display apparatus manufactured using the apparatus illustrated in FIG. 1, according to an exemplary embodiment. FIG. 4 is a cross-sectional view of part of the display apparatus manufactured using the apparatus illustrated in FIG. 1, according to another exemplary embodiment.

Referring to FIGS. 1 through 4, an apparatus 100 for manufacturing a display apparatus may have various shapes. For example, the apparatus 100 for manufacturing the display apparatus may be formed in the form of a chemical vapor deposition (CVD) apparatus, an atomic layer deposition (ALD) apparatus, or a sputtering apparatus. However, hereinafter, for convenience of explanation, a case where the apparatus 100 for manufacturing the display apparatus is formed in the form of a CVD apparatus, will be described in detail.

The apparatus 100 for manufacturing the display apparatus may include a chamber 110, a deposition gas supplying unit 130, a stage 140, a first mask 160, a second mask 170, a mask supporting unit 150, and a suction unit 180.

A space may be formed in the chamber 110. The chamber 110 may be formed so that part of the chamber 110 may be open. A device for opening/closing an open region, e.g., a gate valve 120, may be installed at the open part of the chamber 110.

The deposition gas supplying unit 130 may be installed at various portions of the chamber 110, e.g., an upper portion and sides of the chamber 110. The deposition gas supplying unit 130 may be connected to the outside, and may supply a deposition gas into the chamber 110. The deposition gas may include various gases according to the shape of the apparatus 100 for manufacturing the display apparatus. For example, the deposition gas may include gas used in a CVD apparatus, gas used in an ALD apparatus, or gas used in a sputtering apparatus. Since the above-described deposition gas is gas that is generally used in the above-described apparatuses, a detailed description thereof will be omitted. Also, hereinafter, a case where the deposition gas supplying unit 130 is installed at the upper portion of the chamber 110 will be described in detail.

The deposition gas supplying unit 130 may include a deposition gas storing unit 131, in which the deposition gas is stored, and a deposition gas spraying unit 132 for spraying the deposition gas stored in the deposition gas storing unit 131. For example, the deposition gas storing unit 131 may store a plurality of deposition gases separately from each other. The plurality of deposition gases that are introduced from the outside may be mixed in the deposition gas spraying unit 132.

The stage 140 may be installed in the chamber 110 so as to ascend or descend. For example, a substrate 210, in which a display unit D is formed, may be seated on the stage 140, and the stage 140 may perform a function of, e.g., heating the substrate 210 or applying an electric potential difference thereto.

The first mask 160 and the second mask 170 may be installed to be exchanged with each other. The first mask 160 and the second mask 170 may be introduced into the chamber 110 from the outside, e.g., via a robot arm 190, and may be exchanged with each other according to a process. For example, when the first mask 160 is replaced with the second mask 170, the first mask 160 is moved to the outside by using the robot arm 190, and then, the second mask 170 may be installed inside the chamber 110 by using the robot arm 190.

In detail, the first mask 160 may be positioned between the deposition gas supplying unit 130 and the stage 140, and may include at least two first openings 160a above the stage 140. For example, a plurality of first openings 160a may be provided in the first mask 160 to overlap the display unit D on the stage 140. The plurality of first openings 160a may be formed to be spaced apart from each other along a horizontal direction by a predetermined distance. For example, the plurality of first openings 160a may constitute patterns. For example, the first openings 160a may be formed to correspond to, e.g., overlap, organic light-emitting devices 280 (FIGS. 3-4) of the display unit D, e.g., each of the first openings 160a may correspond to a respective organic light-emitting device 280.

The second mask 170 may include one second opening 170a. For example, the second opening 170a may be formed to correspond to the display unit D, e.g., the size of the second opening 170a may be larger than that of the display unit D.

The deposition gas may pass through the above-described first mask 160 and second mask 170 so that an inorganic layer may be formed on the display unit D. In detail, the deposition gas may pass through the first opening 160a of the first mask 160, so that a first inorganic layer U1 (FIG. 3) having a shape of the pattern of the first opening 160a may be formed on the organic light-emitting device 280 of the display unit D. Also, the deposition gas may pass through the second opening 170a of the second mask 170, so that a second inorganic layer U2 (FIG. 3) having a shape of the second opening 170a may be formed on the, e.g., entire, display unit D to fully shield the display unit D.

The mask supporting unit 150 may fix the first mask 160 or the second mask 170. For example, the mask supporting unit 150 may fix the first mask 160 or the second mask 170 in a state in which the first mask 160 or the second mask 170 is seated on the mask supporting unit 150. In other words, the mask supporting unit 150 may fix the first mask 160 during deposition therethrough, and may fix the second mask 170 during deposition therethrough.

The suction unit 180 may be connected to the chamber 110, and may discharge gas from the chamber 110 to the outside or may maintain a predetermined pressure in the chamber 110, e.g., in a vacuum state or an atmospheric pressure state. For example, the suction unit 180 may include a connection pipe 181 connected to the chamber 110 and a pump 182 installed at the connection pipe 181.

The apparatus 100 for manufacturing the display apparatus may further include a power supply unit (not shown) that constitutes a potential difference according to the shape of each apparatus, and a plasma forming portion (not shown) that forms plasma in addition to the above configuration. In this case, the above-described configuration is the same as or similar to that of the general sputtering apparatus, the CVD apparatus or the ALD apparatus and thus, a detailed description thereof will be omitted.

When a display apparatus 200 is manufactured using the apparatus 100 for manufacturing the display apparatus, first, the display unit D is formed on the substrate 210. Then, the substrate 210 with the display unit D is inserted into the chamber 110, and a part of a thin film encapsulation layer E (FIG. 3) is formed on the substrate 210 using the apparatus 100 for manufacturing the display apparatus.

In detail, referring to FIG. 3, thin film transistors (TFTs) may be disposed on the display unit D, and a passivation layer 270 may be formed to cover the TFTs. Then, the organic light-emitting device 280 may be formed on the passivation layer 270.

In detail, the substrate 210 may be formed of a glass material. However, embodiments are not limited thereto. For example, the substrate 210 may be formed of a plastic material or a metal material, e.g., stainless steel (SUS) or titanium (Ti). Also, the substrate 210 may be formed of polyimide (PI). Hereinafter, for convenience of explanation, a case where the substrate 210 is formed of a glass material, will be described in detail.

A buffer layer 220 may be further formed on a top surface of the substrate 210 using an organic compound and/or an inorganic compound, e.g., $SiO_x(x≥1)$ or $SiN_x(x≥1)$. After an active layer 230 arranged in a predetermined pattern is formed on the buffer layer 220, the active layer 230 is buried by a gate insulating layer 240. The active layer 230 has a source region 231 and a drain region 233, and further includes a channel region 232 between the source region 231 and the drain region 233.

The active layer 230 may be formed to include various materials. For example, the active layer 230 may include an inorganic semiconductor material, e.g., amorphous silicon or crystalline silicon. As another example, the active layer 230 may include an oxide semiconductor. As yet another example, the active layer 230 may include an organic semiconductor material. However, for convenience of explanation, a case where the active layer 230 is formed of amorphous silicon, will be described in detail.

The active layer 230 may be formed by forming an amorphous silicon layer on the buffer layer 220, and then crystallizing the amorphous silicon layer so as to form a polycrystalline silicon layer, followed by patterning the polycrystalline silicon layer. The active layer 230 is doped by impurities of the source region 231 and the drain region 233 according to the type of TFTs, e.g., a driving TFT (not shown) or a switching TFT (not shown).

A gate electrode 250 that corresponds to the active layer 230, and an intermediate insulating layer 260 that buries the gate electrode 250, are formed on a top surface of the gate insulating layer 240. After a contact hole H1 is formed in the intermediate insulating layer 260 and the gate insulating layer 240, a source electrode 271 and a drain electrode 272 are formed on the intermediate insulating layer 260 so as to be in contact with the source region 231 and the drain region 233 through the contact hole H1.

The passivation layer 270 is formed on an upper portion of the TFTs, and a pixel electrode 281 of the organic light-emitting device 280 is formed on the passivation layer 270. The pixel electrode 281 is in contact with the drain electrode 272 of a corresponding TFT through a via hole H2 in the passivation layer 270. The passivation layer 270 may be formed of an inorganic material and/or organic material and as a single layer or two or more layers. The passivation layer 270 may also be formed as a planarization layer so that a top surface of the passivation layer 270 is flat regardless of a bend of a lower layer, or may be formed to be bent along a curve of a layer disposed under the passivation layer 270. The passivation layer 270 may be formed of a transparent insulating material so that resonance effects may be achieved.

After the pixel electrode 281 is formed on the passivation layer 270, a pixel defining layer 290 is formed of an organic and/or inorganic material so as to cover the pixel electrode 281 and the passivation layer 270. An opening H3 is formed in the pixel defining layer 290 to expose a portion of the pixel electrode 281.

An intermediate layer 282 and an opposite electrode 283 are formed at least on the pixel electrode 281, e.g., at least a portion of each of the intermediate layer 282 and the opposite electrode 283 is in the opening H3 to cover the exposed pixel electrode 281 and exposed sidewalls of the pixel defining layer 290. Polarities of the pixel electrode 281 and the opposite electrode 283 may be opposite to each other. For example, the pixel electrode 281 may function as an anode electrode, and the opposite electrode 283 may function as a cathode electrode. In another example, polarities of the pixel electrode 281 and the opposite electrode 283 may be reversed.

The pixel electrode 281 and the opposite electrode 283 may be insulated from each other due to the intermediate layer 282, and voltages having different polarities are applied to the intermediate layer 282 so that emission may be performed by the organic light-emitting layer. For example, the intermediate layer 282 may include an organic light-emitting layer. In another example, the intermediate layer 282 may additionally include at least one of an organic emission layer, a hole injection layer (HIL), a hole transport layer (HTL), an electron transport layer (ETL), and an electron injection layer (EIL).

One unit pixel is formed of a plurality of sub pixels. The plurality of sub pixels may emit light of various colors. For example, the plurality of sub pixels may include sub pixels that emit red light, green light, and blue light or sub pixels that emit red light, green light, blue light and white light.

The above-described display unit D may include a plurality of inorganic layers or an inorganic layer and an organic layer.

For example, the organic layer of the display unit D may be formed of a polymer as a single layer formed of, e.g., polyethylene terephthalate, polyimide, polycarbonate, epoxy, polyethylene, and polyacrylate, or as a stack of layers thereof. For example, the organic layer may be formed of polyacrylate, e.g., a polymer of a monomer composite including diacrylate-based monomer and triacrylate-based monomer. A monoacrylate-based monomer may be further included in the monomer composite. Also, a well-known photoinitiator, e.g., thermoplastic polyolefin (TPO), may be further included in the monomer composite. However, embodiments are not limited thereto.

The inorganic layer of the display unit D may be a single layer including a metal oxide or a metal nitride or a stack layer thereof. In detail, the inorganic layer may include at least one of $SiN_x$, $Al_2O_3$, $SiO_2$, and $TiO_2$.

An uppermost layer of the display unit D exposed to the outside may be formed as an inorganic layer so as to prevent vapor permeability into the organic light-emitting device. The display unit D may include at least one sandwich structure in which at least one organic layer is inserted between at least two inorganic layers. As another example, the display unit D may include at least one sandwich structure in which at least one inorganic layer is inserted between at least two organic layers. As yet another example, the display unit D may include a sandwich structure in which at least one organic layer is inserted between at least two inorganic layers, and a sandwich structure in which at least one inorganic layer is inserted between at least two organic layers.

The display unit D may include a first inorganic layer U1, a second inorganic layer U2, a first organic layer O1, and a second organic layer (not shown), which are sequentially formed from an upper portion of the organic light-emitting device 280.

As another example, the display unit D may include the first inorganic layer U1, the second inorganic layer U2, the first organic layer O1, a third inorganic layer U3, the second organic layer (not shown), and a fourth inorganic layer (not shown), which are sequentially formed from the upper portion of the organic light-emitting device 280.

As yet another example, the display unit D may include the first inorganic layer U1, the second inorganic layer U2, the first organic layer O1, the third inorganic layer U3, the second organic layer (not shown), the fourth inorganic layer (not shown), a third organic layer (not shown), and a fifth inorganic layer (not shown).

A halogenation metal layer L including lithium fluoride (LiF) may be additionally included between the organic light-emitting device 280 and the first inorganic layer U1 and between the opposite electrode 283 and the second inorganic layer U2. The halogenations metal layer L may prevent the organic light-emitting device 280 from being damaged when the first inorganic layer U1 is formed.

The above-described first organic layer O1 may have a smaller area than that of the third inorganic layer U3, and the second organic layer may have a smaller area than that of the fourth inorganic layer. Also, the above-described first inorganic layer U1 may be formed only in part of the display unit D.

Hereinafter, for convenience of explanation, a case where the thin film encapsulation layer E includes the first inorganic layer U1, the second inorganic layer U2, the first organic layer O1, and the third inorganic layer U3, will be described in detail.

In an operation of forming the thin film encapsulation layer E, first, the display unit D is formed by stacking the above-described layers on the substrate 210 and then, the halogenations metal layer L may be formed on the display unit D. In this case, the halogenation metal layer L may be formed on the pixel defining layer 290 and the opposite electrode 283 stacked on the intermediate layer 282, e.g., the halogenation metal layer L may be formed directly on the opposite electrode 283. In this case, the halogenation metal layer L is formed along an outer, i.e., upper, surface of the opposite electrode 283, so that a curve is formed in the halogenation metal layer L and the halogenation metal layer L is inserted into the intermediate layer 282 formed in an opened region of the pixel defining layer 290. For example, the halogenation metal layer L may be conformally formed on the opposite electrode 283 to trace an outline of the opposite electrode 283 inside the opening H3 of the pixel defining layer 290.

Thus, a curve of the halogenation metal layer L may be formed between a portion of the display unit D in which the organic light-emitting device 280 is formed and another portion of the display unit D in which the organic light-emitting device 280 is not formed. In particular, the portion of the display unit D in which the organic light-emitting device 280 is formed, may be formed to be inserted into the substrate 210. For example, as illustrated in FIG. 3, the curve of the halogenation metal layer L may be oriented toward the substrate 210 to be inserted in the opening H3 of the pixel defining layer 290, so a portion of an upper surface of the halogenation metal layer L inside the opening H3 of the pixel defining layer 290 may define an indent, i.e., opening, relative to an upper surface of the pixel defining layer 290.

Referring back to FIG. 1, when formation of the display unit D with the halogenation metal layer L is completed, as described above, the substrate 210 in which the display unit D is formed, is inserted into the chamber 110. In this case, the gate valve 120 is opened to open the chamber 110. The substrate 210 may be transferred by the robot arm or a shuttle into the chamber 110 through the gate valve 120.

After the substrate 210 is seated on the state 140, the first mask 160 is fixed to the mask supporting unit 150. The position of the first mask 160 may be adjusted by checking positions of the first mask 160 and the substrate 210, e.g., the position of the first mask 160 may be adjusted to have the first openings 160a of the first mask 160 overlap corresponding openings H3 of the pixel defining layer 290 on the substrate 210.

Subsequently, the deposition gas may be sprayed by the deposition gas supplying unit 130 toward the first mask 160, and may be supplied to the substrate 210 through the first openings 160a of the first mask 160. In this case, the first mask 160 may be in contact with the substrate 210 or in close proximity to the substrate 210.

According to an embodiment, referring back to FIG. 3, the deposition gas that passes through the first mask 160 may be deposited onto the display unit D, so that the first inorganic layer U1 may be formed. In this case, the first inorganic layer U1 may be formed to be inserted into the inserted portion of the display unit D in which the organic light-emitting device 280 is formed. In other words, as illustrated in FIG. 3, the first inorganic layer U1 may be formed on the upper surface of the indented halogenation metal layer L to overlap and fill the opening H3 of the pixel defining layer 290. For example, when the first inorganic layer U1 is formed, the first inorganic layer U1 and the halogenation metal layer L may constitute nearly one plane, e.g., an upper surface of the first inorganic layer U1 and a portion of the halogenation metal layer L adjacent to the first inorganic layer U1 may be level.

As described above, when formation of the first inorganic layer U1 is finished, the first mask 160 may be exchanged with the second mask 170. In this case, exchanging of the first mask 160 and the second mask 170 may be performed using the robot arm.

When the second mask 170 is seated on the mask supporting unit 150, a position of the second mask 170 and a position of the substrate 210 may be aligned in predetermined positions. Subsequently, the deposition gas supplying unit 130 may supply the deposition gas so that the second inorganic layer U2 may be formed on the entire surface of the display unit D. In this case, the deposition gas may be the same as or similar to the deposition gas used to form the first inorganic layer U1.

As described above, when the second inorganic layer U2 is formed on the entire surface of the display unit D, the second inorganic layer U2 may fully shield, e.g., cover, the first inorganic layer U1 and the halogenation metal layer L. In this case, one surface of the second inorganic layer U2 may be planarized without forming a curve in the second inorganic layer U2. In particular, one surface of the second inorganic layer U2 that is not in contact with the first inorganic layer U1, may constitute a flat surface.

As described above, after the second inorganic layer U2 is formed, the first organic layer O1 may be formed on the second inorganic layer U2. In this case, the first organic layer O1 may be stacked using an inkjet printing process. In detail, the first organic layer O1 may be formed by supplying an organic material to the second inorganic layer U2 through nozzles. In this case, the first organic layer O1 may be formed using an inkjet printing apparatus that is separately provided from the apparatus 100 for manufacturing the display apparatus.

If the first inorganic layer U1 were not formed on the indented portion of the halogenation metal layer L above the organic light-emitting device 280, the second inorganic layer U2 would be formed to be bent along the halogenation metal layer L, i.e., to have an inserted shape inside the opening H3. However, in this case, an organic material would have to be dispersed along one surface of the second inorganic layer U2 to be coated on the second inorganic layer U2. In this case, when one surface of the second inorganic layer U2 is formed to be bent, the organic material is not fully inserted into the inserted portion of the second inorganic layer U2 so that the performance of the thin film encapsulation layer E may be lowered.

However, according to embodiments, when a surface on which the second inorganic layer U2 is to be formed, is planarized by forming the first inorganic layer U1 and then the second inorganic layer U2 is formed, one surface of the second inorganic layer U2 on which the first organic layer O1 is formed, is hardly bent so that the first organic layer O1 may be uniformly coated.

As described above, after the first organic layer O1 is formed, the third inorganic layer U3 may be formed thereon. In this case, the third inorganic layer U3 may be formed in the same or similar method as that of forming the second inorganic layer U2. Thus, a detailed description thereof will be omitted.

Thus, in the apparatus 100 and method for manufacturing the display apparatus 200, when the thin film encapsulation layer E is formed, the first organic layer O1 is uniformly coated on, e.g., directly on, the second inorganic layer U2. Therefore, the second inorganic layer U2 may be fully shielded. Also, in the apparatus 100 and method for manufacturing the display apparatus, the first organic layer O1 is continuously formed on the second inorganic layer U2, so that the performance of the thin film encapsulation layer E may be improved. In addition, the display apparatus 200 manufactured using the apparatus 100 and method for manufacturing the display apparatus 200 includes the solid thin film encapsulation layer E that blocks moisture and oxygen, so that the life span of the display apparatus 200 may be increased.

In addition to the above-described process, a display apparatus 200' may be manufactured using a different method. In detail, referring to FIG. 4, after the halogenation metal layer L is formed on the display unit D, the second inorganic layer U2 may be formed on the halogenation metal layer L. In this case, the halogenation metal layer L may be stacked as described above, so that a curve may be formed in the halogenation metal layer L. The second inorganic layer U2 may be stacked along the surface of the halogenation metal layer L so that a curve may be formed in the second inorganic layer U2. The second inorganic layer U2 may be formed using the second mask 170, as described above. In this case, a detailed process of forming the second inorganic layer U2 via the second mask 170 will be omitted.

In the above case, the portion in which the organic light-emitting device 280 is formed, of one surface of the second inorganic layer U2 that is not in contact with the halogenation metal layer L may be inserted into the substrate 210. Thus, a curve may be formed in one surface of the second inorganic layer U2, and in particular, a groove may be formed in one surface of the second inorganic layer U2. That is, as illustrated in FIG. 4, a portion of the second inorganic layer U2 may be inserted, i.e., indented, into the opening H3 of the pixel defining layer 290.

When formation of the second inorganic layer U2 is finished, the first inorganic layer U1 may be formed on the second inorganic layer U2. In this case, the first inorganic layer U1 may be formed on the indented portions of the second inorganic layer U2 by forming patterns using the first mask 160, as described above. Hereinafter, a description relating to the method of forming the first inorganic layer U1 via the first mask 160 will be omitted.

As described above, when the second inorganic layer U2 and the first inorganic layer U1 are sequentially formed, the upper surface of the first inorganic layer U1, i.e., on which the first organic layer O1 is to be stacked, and a portion of the upper surface of the second inorganic layer U2 may constitute one plane, i.e., may be level. In this case, the first organic layer O1 is stacked on, e.g., directly on, the level upper surfaces of the first and second inorganic layers U1 and U2 using an inkjet printing process, as described above, and thus may be uniformly coated and stacked on the first inorganic layer U1 and the second inorganic layer U2.

Subsequently, as described above, the third inorganic layer U3 is stacked on the first organic layer O1 so that the thin film encapsulation layer E may be formed. Thus, in the apparatus 100 and method for manufacturing the display apparatus 200', the first organic layer O1 is continuously formed on the first and second inorganic layers U1 and U2, so that the performance of the thin film encapsulation layer E may be improved.

In addition, the display apparatus 200' manufactured using the apparatus 100 and method for manufacturing the display apparatus may include the solid thin film encapsulation layer E that blocks moisture and oxygen, so that the life span of the display apparatus 200' may be increased. Further, in the apparatus 100 and method for manufacturing the display apparatus, the first inorganic layer U1 and the second inorganic layer U2 may be continuously formed in one equipment so that manufacturing time and cost may be reduced.

As described above, according to the one or more of the above exemplary embodiments, a display apparatus having improved electrical characteristics can be manufactured. These general and detailed aspects may be implemented using a system, a method, a computer program or a combination of the system, the method and the computer program.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method for manufacturing a display apparatus, the method comprising:
    forming a display unit on a substrate, the display unit including organic light-emitting devices;
    spraying a deposition gas onto the substrate from a deposition gas supplying unit through at least two openings of a first mask, such that a first inorganic layer is formed in at least two corresponding concave portions of the organic light-emitting devices in the display unit; and
    forming a second inorganic layer on the first inorganic layer.

2. The method as claimed in claim 1, wherein forming the first inorganic layer includes forming the first inorganic layer in a form of a pattern on the display unit using the first mask with the at least two openings.

3. The method as claimed in claim 1, wherein forming the second inorganic layer includes planarizing one surface of the second inorganic layer.

4. The method as claimed in claim 1, further comprising forming a halogenation metal layer of lithium fluoride (LiF) between the first inorganic layer and the display unit and between the second inorganic layer and the display unit.

5. The method as claimed in claim 1, further comprising forming a first organic layer on the second inorganic layer using an inkjet printing process.

6. The method as claimed in claim 1, wherein the second inorganic layer is formed before the first inorganic layer, a portion of the second inorganic layer being indented into the concave portions of the organic light-emitting devices.

7. The method as claimed in claim 6, wherein the first inorganic layer is formed in the at least two corresponding concave portions of the organic light-emitting devices to contact an upper surface of the second inorganic layer.

8. The method as claimed in claim 1, wherein the first inorganic layer is formed before the second inorganic layer, the second inorganic layer contacting an upper surface of the first inorganic layer.

9. A method for manufacturing a display apparatus, the method comprising:
    forming a display unit on a substrate;
    forming a second inorganic layer along an outer surface of the display unit; and
    forming a first inorganic layer on a concave portion of the second inorganic layer so as to fill the concave portion of the second inorganic layer, such that the first inorganic layer is only in the concave portion of the second inorganic layer.

10. The method as claimed in claim 9, wherein forming the first inorganic layer includes forming the first inorganic layer in a form of a pattern on the second inorganic layer using a first mask with at least two openings.

11. The method as claimed in claim 9, wherein the first inorganic layer and the second inorganic layer constitutes one plane.

12. The method as claimed in claim 9, further comprising forming a lithium fluoride (LiF) layer between the second inorganic layer and the display unit.

13. The method as claimed in claim 9, further comprising forming a first organic layer on the first inorganic layer and the second inorganic layer using an inkjet printing process.

14. A method for manufacturing a display apparatus, the method comprising:
    forming a display unit on a substrate;
    forming a second inorganic layer along an outer surface of the display unit; and
    forming a first inorganic layer on a concave portion of the second inorganic layer so as to fill the concave portion of the second inorganic layer,
    wherein forming the first inorganic layer includes forming the first inorganic layer in a form of a pattern on the display unit using a first mask with at least two openings.

* * * * *